United States Patent
Chen et al.

(10) Patent No.: US 10,658,407 B2
(45) Date of Patent: May 19, 2020

(54) DISPLAY PANEL, METHOD OF MANUFACTURING DISPLAY PANEL, FINGERPRINT IDENTIFICATION DEVICE, AND METHOD OF IDENTIFYING FINGERPRINT

(71) Applicants: BOE Technology Group Co., Ltd., Beijing (CN); Hefei BOE Optoelectronics Technology Co., Ltd., Anhui (CN)

(72) Inventors: Yimin Chen, Beijing (CN); Xianjie Shao, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 56 days.

(21) Appl. No.: 16/030,981

(22) Filed: Jul. 10, 2018

(65) Prior Publication Data
US 2019/0206914 A1 Jul. 4, 2019

(30) Foreign Application Priority Data
Jan. 2, 2018 (CN) .......................... 2018 1 0002525

(51) Int. Cl.
*G06K 9/20* (2006.01)
*H01L 27/146* (2006.01)
(Continued)

(52) U.S. Cl.
CPC ...... *H01L 27/14612* (2013.01); *G06K 9/0004* (2013.01); *G06K 9/00087* (2013.01);
(Continued)

(58) Field of Classification Search
CPC .......................... G06K 9/0004–9/00046; G06K 9/00006–9/0012
See application file for complete search history.

(56) References Cited

U.S. PATENT DOCUMENTS 6,993,980 B2 * 2/2006 Shimizu .................. G01L 1/146
73/862.046
2009/0027352 A1 * 1/2009 Abele .................. G06K 9/0002
345/173
(Continued)

Primary Examiner — Brian Werner
(74) Attorney, Agent, or Firm — Westman, Champlin & Kochler, P.A.

(57) ABSTRACT

Embodiments of the present disclosure provide a display panel, a method of manufacturing the display panel, a fingerprint identification device, and a method of identifying a fingerprint. The display panel includes first and second substrates. The first substrate is formed with switch transistors arranged in an array, and photosensitive elements arranged in an array and connected with the switch transistors. The second substrate is formed with conductive contact members, the contact members each have an end adjacent to the first substrate, and the end of each of the contact members is spaced from the first substrate so that when the second substrate is deformed by a force, the end of at least one of the contact members electrically contacts the first substrate so that at least one of the switch transistors in a position corresponding to the at least one of the contact members is turned on.

20 Claims, 3 Drawing Sheets

(51) Int. Cl.
*G06K 9/00* (2006.01)
*H01L 27/30* (2006.01)
*H01L 27/28* (2006.01)

(52) U.S. Cl.
CPC .... *H01L 27/1469* (2013.01); *H01L 27/14634* (2013.01); *H01L 27/14636* (2013.01); *H01L 27/283* (2013.01); *H01L 27/307* (2013.01)

(56) References Cited

U.S. PATENT DOCUMENTS

2015/0234220 A1\* 8/2015 Hwang ............... G02F 1/13338
349/12
2015/0369661 A1\* 12/2015 Lin ...................... G06K 9/0004
250/227.11

\* cited by examiner

DISPLAY PANEL, METHOD OF MANUFACTURING DISPLAY PANEL, FINGERPRINT IDENTIFICATION DEVICE, AND METHOD OF IDENTIFYING FINGERPRINT

CROSS-REFERENCE TO RELATED APPLICATION

This application claims the benefit of Chinese Patent Application No. 201810002525.7, filed with the State Intellectual Property Office of China on Jan. 2, 2018, the whole disclosure of which is incorporated herein by reference.

BACKGROUND

1. Technical Field

Embodiments of the present disclosure relate to a display panel, a method of manufacturing the display panel, a fingerprint identification device, and a method of identifying a fingerprint.

2. Description of the Related Art

An optical fingerprint identification system in related art comprises a photoelectric detector.

SUMMARY

Embodiments of the present disclosure provide a display panel comprising: a first substrate and a second substrate disposed opposite to each other, wherein the first substrate is formed with: a plurality of switch transistors arranged in an array, and a plurality of photosensitive elements arranged in an array and respectively connected with the plurality of switch transistors; and wherein the second substrate is formed with a plurality of conductive contact members, the plurality of contact members each have an end adjacent to the first substrate, and the end of each of the contact members is spaced from the first substrate by a preset distance so that when the second substrate is deformed by a force, the end of at least one of the contact members electrically contacts the first substrate so that at least one of the switch transistors in a position corresponding to the at least one of the contact members is turned on.

According to embodiments of the present disclosure, the switch transistors each have a control electrode configured to control a turn-on of the switch transistor, a first electrode and a second electrode, the second electrode is connected with one of the photosensitive elements to input an induced current generated by the one of the photosensitive elements when the one of the photosensitive elements is irradiated by a light, and the first electrode is configured to output the induced current when the switch transistor is turned on.

According to embodiments of the present disclosure, the first substrate is further formed with scan lines and data lines; the first electrodes of the switch transistors are connected with the data lines, respectively; and the contact members are electrically connected with the scan lines of the first substrate, respectively.

According to embodiments of the present disclosure, an orthogonal projection of the end of each of the contact members on the first substrate partially overlaps an orthogonal projection of the control electrode of one, in a position corresponding to the each of the contact members, of the switch transistors on the first substrate, and the each of the contact members is spaced from the control electrode of the one of the switch transistors by the preset distance so that when the second substrate is deformed by the force, at least one of the contact members in a location where the force is applied electrically contacts the control electrode of at least one of the switch transistors in a position corresponding to the at least one of the contact members.

According to embodiments of the present disclosure, a surface of the first substrate adjacent to the second substrate is covered with a protective layer; and the protective layer is formed with a plurality of through holes, and each of the contact members electrically contacts the control electrode of one, located in a position corresponding to the each of the contact members, of the switch transistors through one of the through holes.

According to embodiments of the present disclosure, an orthogonal projection of each of the through holes on the first substrate partially overlaps an orthogonal projection of the control electrode of one, corresponding to the each through hole, of the switch transistors on the first substrate.

According to embodiments of the present disclosure, the preset distance is less than a thicknesses of the protective layer.

According to embodiments of the present disclosure, the contact member comprises a spacer.

According to embodiments of the present disclosure, the contact members are doped with an electrically-conductive material.

According to embodiments of the present disclosure, the plurality of switch transistors and the plurality of photosensitive elements are disposed in a display region.

Embodiments of the present disclosure further provide a method of manufacturing a display panel, the method comprising: manufacturing a first substrate, wherein the first substrate is formed with: a plurality of switch transistors arranged in an array, and a plurality of photosensitive elements arranged in an array and respectively connected with the plurality of switch transistors; manufacturing a second substrate, wherein the second substrate is formed with a plurality of conductive contact members, and the plurality of contact members each have an end adjacent to the first substrate; and assembling the first substrate and the second substrate to form a display panel, wherein the end of each of the contact members is spaced from the first substrate by a preset distance so that when the second substrate is deformed by a force, the end of at least one of the contact members electrically contacts the first substrate so that at least one of the switch transistors in a position corresponding to the at least one of the contact members is turned on.

According to embodiments of the present disclosure, the switch transistors each have a control electrode configured to control a turn-on of the switch transistor, a first electrode and a second electrode, the second electrode is connected with one of the photosensitive elements to input an induced current generated by the one of the photosensitive elements when the one of the photosensitive elements is irradiated by a light, and the first electrode is configured to output the induced current when the switch transistor is turned on; the first substrate is further formed with scan lines and data lines; the first electrodes of the switch transistors are connected with the data lines, respectively; and the contact members are electrically connected with the scan lines of the first substrate, respectively.

According to embodiments of the present disclosure, an orthogonal projection of the end of each of the contact members on the first substrate partially overlaps an orthogonal projection of the control electrode of one, in a position corresponding to the each of the contact members, of the switch transistors on the first substrate, and the each of the contact members is spaced from the control electrode of the one of the switch transistors by the preset distance so that when the second substrate is deformed by the force, at least one of the contact members in a location where the force is applied electrically contacts the control electrode of at least one of the switch transistors in a position corresponding to the at least one of the contact members.

According to embodiments of the present disclosure, the method further comprises: after manufacturing the first substrate, forming a protective layer on a surface of the first substrate adjacent to the second substrate; and forming a plurality of through holes in the protective layer, wherein each of the contact members electrically contacts the control electrode of one, located in a position corresponding to the each of the contact members, of the switch transistors through one of the through holes, wherein an orthogonal projection of each of the through holes on the first substrate partially overlaps an orthogonal projection of the control electrode of one, corresponding to the each through hole, of the switch transistors on the first substrate.

Embodiments of the present disclosure further provide a fingerprint identification device, comprising: a light source, an identification module, and the above display panel, wherein the identification module is connected with the display panel; wherein the light source has a light emitting face facing towards the display panel, and is configured to emit a detection light; wherein the display panel is configured such that when a finger of a user is pressed against the display panel, at least one of the switch transistors is turned on, and each of the photosensitive elements is configured to generate an induced current according to a part of the detection light reflected from the finger of the user; and wherein the identification module is configured to identify a fingerprint of the user according to the induced current.

According to embodiments of the present disclosure, the switch transistors each have a control electrode configured to control a turn-on of the switch transistor, a first electrode and a second electrode, the second electrode is connected with one of the photosensitive elements to input the induced current generated by the one of the photosensitive elements, and the first electrode is configured to output the induced current when the switch transistor is turned on; and the display panel is configured such that when the finger of the user is pressed against the display panel, at least one of the contact members in a location where a force is applied by the finger electrically contacts the control electrode of at least one of the switch transistors in a position corresponding to the at least one of the contact members, so that the at least one of the switch transistors is turned on.

According to embodiments of the present disclosure, the first substrate is further formed with scan lines and data lines; the first electrodes of the switch transistors are connected with the data lines, respectively; the contact members are electrically connected with the scan lines of the first substrate, respectively; and the scan lines are connected with the control electrodes of the switch transistors through the contact members, respectively.

According to embodiments of the present disclosure, an orthogonal projection of the end of each of the contact members on the first substrate partially overlaps an orthogonal projection of the control electrode of one, in a position corresponding to the each of the contact members, of the switch transistors on the first substrate, and the each of the contact members is spaced from the control electrode of the one of the switch transistors by the preset distance so that when the second substrate is deformed by the force, at least one of the contact members in a location where the force is applied electrically contacts the control electrode of at least one of the switch transistors in a position corresponding to the at least one of the contact members.

Embodiments of the present disclosure further provide a method of identifying a fingerprint by using the above fingerprint identification device, the method comprising: controlling the light source to emit the detection light; inputting a control signal, wherein when the control signal is inputted to the control electrode of at least one of the switch transistors through at least one of the contact members in a position corresponding to the at least one of the switch transistors, the display panel generates an induced current according to a part of the detection light reflected from the finger of the user; and identifying a fingerprint of the user according to the induced current.

According to embodiments of the present disclosure, the first substrate is further formed with scan lines and data lines, and the first electrodes of the switch transistors are connected with the data lines, respectively; the contact members are electrically connected with the scan lines of the first substrate, respectively; and the scan lines are connected with the control electrodes of the switch transistors through the contact members, respectively; and inputting the control signal comprises inputting the control signal to the scan lines of the first substrate.

DETAILED DESCRIPTION OF THE EMBODIMENTS

Figure 1:
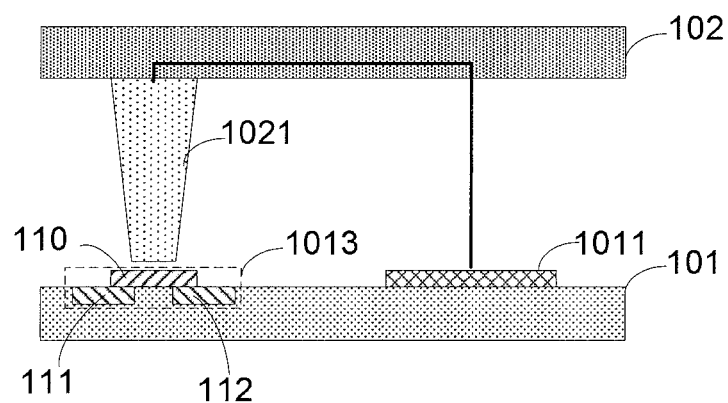
FIG. 1 is a schematic diagram showing a configuration of a display panel according to an embodiment of the present disclosure.

In order that the objects, features, and advantages of the present disclosure become more apparent and are more readily appreciated, a further description of the present disclosure will be made as below with reference to embodiments of the present disclosure taken in conjunction with the accompanying drawings.

Referring to FIG. 1 to FIG. 3 and FIG. 5, embodiments of the present disclosure provide a display panel. The display panel comprises a first substrate 101 and a second substrate 102 disposed opposite to each other. The first substrate 101 is formed with: a plurality of switch transistors 1013 arranged in an array, and a plurality of photosensitive elements 1014 arranged in an array and respectively connected with the plurality of switch transistors 1013. The second substrate 102 is formed with a plurality of conductive contact members 1021. The plurality of contact members 1021 each have an end adjacent to the first substrate 101, and the end of each of the contact members 1021 is spaced from the first substrate 101 by a preset distance so that when the second substrate 102 is deformed by a force, the end of at least one of the contact members 1021 electrically contacts the first substrate 101 so that at least one of the switch transistors 1013 in a position corresponding to the at least one of the contact members 1021 is turned on. For example, the plurality of switch transistors 1013 and the plurality of photosensitive elements 1014 are disposed in a display region of the display panel.

In an embodiment of the present disclosure, referring to FIG. 1 to FIG. 3 and FIG. 5, the switch transistors 1013 each have a control electrode 110 configured to control a turn-on of the switch transistor 1013, a first electrode 111 and a second electrode 112. The second electrode 112 is connected with one of the photosensitive elements 1014 to input an induced current generated by the one of the photosensitive elements 1014 when the one of the photosensitive elements 1014 is irradiated by a light, and the first electrode 111 is configured to output the induced current when the switch transistor 1013 is turned on.

In an embodiment of the present disclosure, referring to FIG. 1 to FIG. 3 and FIG. 5, the first substrate 101 is formed with scan lines 1011 and data lines 1012. The scan lines 1011 and the data lines 1012 may cross one another. The first electrodes 111 of the switch transistors 1013 are connected with the data lines 1012, respectively, and the contact members 1021 are electrically connected with the scan lines 1011 of the first substrate 101, respectively.

In an embodiment of the present disclosure, referring to FIG. 1 to FIG. 3 and FIG. 5, an orthogonal projection of the end of each of the contact members 1021 on the first substrate 101 partially overlaps an orthogonal projection of the control electrode 110 of one, in a position corresponding to the each of the contact members 1021, of the switch transistors 1013 on the first substrate 101, and the each of the contact members 1021 is spaced from the control electrode 110 of the one of the switch transistors 1013 by the preset distance so that when the second substrate 102 is deformed by the force, at least one of the contact members 1021 in a location where the force is applied electrically contacts the control electrode 110 of at least one of the switch transistors 1013 in a position corresponding to the at least one of the contact members 1021.

Figure 2:
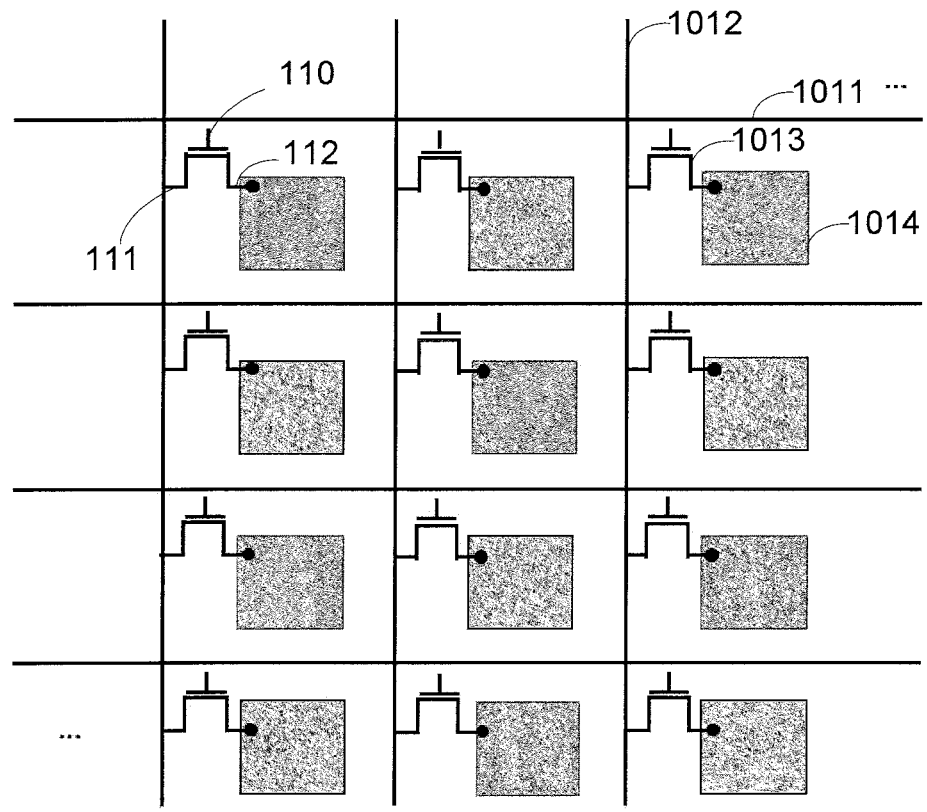
FIG. 2 is a schematic diagram showing a connectional relationship among components of a circuit of a first substrate according to an embodiment of the present disclosure.
Figure 3:
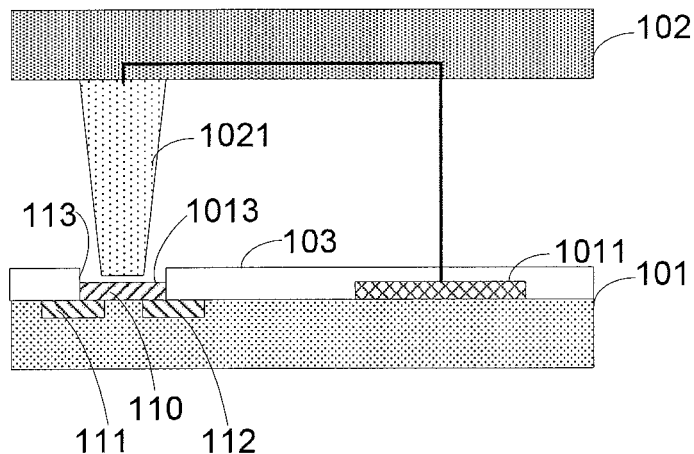
FIG. 3 is a schematic diagram showing a configuration of a display panel according to another embodiment of the present disclosure.
Figure 5:
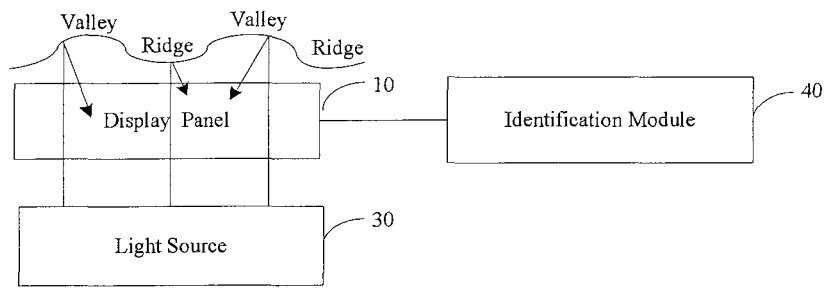
FIG. 5 is a schematic diagram showing a configuration of a fingerprint identification device according to an embodiment of the present disclosure.

In an embodiment of the present disclosure, referring to FIG. 2, FIG. 3 and FIG. 5, a surface of the first substrate 101 adjacent to the second substrate 102 is covered with a protective layer 103, the protective layer 103 is formed with a plurality of through holes 113, and each of the contact members 1021 electrically contacts the control electrode 110 of one, located in a position corresponding to the each of the contact members 1021, of the switch transistors 1013 through one of the through holes 113. An orthogonal projection of each of the through holes 113 on the first substrate 101 may partially overlap an orthogonal projection of the control electrode 110 of one, corresponding to the each through hole 113, of the switch transistors 1013 on the first substrate 101.

FIG. 1 is a schematic diagram showing a configuration of a display panel according to an embodiment of the present disclosure. Referring to FIG. 1, the display panel comprises a first substrate 101 and a second substrate 102 assembled together.

FIG. 2 is a schematic diagram showing a connectional relationship among components of a circuit of the first substrate. Referring to FIG. 2, the first substrate 101 is formed with: scan lines 1011 and data lines 1012 crossing one another, a plurality of switch transistors 1013 arranged in an array, and a plurality of photosensitive elements 1014 arranged in an array. First electrodes 111 of the switch transistors 1013 are connected with the data lines 1012, respectively, and the second electrodes 112 of the switch transistors 1013 are connected with the photosensitive elements 1014, respectively.

The second substrate 102 is formed with a plurality of conductive contact members 1021. An orthogonal projection of an end, adjacent to the first substrate 101, of each of the contact members 1021 on the first substrate 101 partially overlaps an orthogonal projection of a control electrode 110 of one, in a position corresponding to the each of the contact members 1021, of the switch transistors 1013 on the first substrate 101. The contact members 1021 are electrically connected with the scan lines 1011 of the first substrate 101, respectively. The each of the contact members 1021 is spaced from the control electrode 110 of the one of the switch transistors 1013 by a preset distance so that when the second substrate 102 is deformed by a force, at least one of the contact members 1021 in a location where the force is applied electrically contacts the control electrode 110 of at least one of the switch transistors 1013 in a position corresponding to the at least one of the contact members 1021.

For example, the contact members 1021 may be spacers for maintaining a distance between the first substrate 101 and the second substrate 102. The first substrate 101 may be an array substrate of a liquid crystal display panel, while the second substrate 102 may be a color filter substrate of the liquid crystal display panel. The contact members 1021 may be spacers for maintaining a distance between the first substrate 101 and the second substrate 102 in the liquid crystal display panel, or special contact members, for example column-shaped contact members.

In addition, in the above embodiments, the first substrate 101 is formed with the scan line 1011, the data line 1012, the switch transistor 1013, and the photosensitive element 1014, while the second substrate 102 is formed with the conductive contact member 1021. However, any one of the scan line 1011, the data line 1012, the switch transistor 1013, the photosensitive element 1014, and the conductive contact member 1021 may be disposed in one of the first substrate 101 and the second substrate 102 according to requirements.

Furthermore, in the above embodiments, the contact member 1021 electrically contacts the control electrode 110 of the switch transistor 1013 in a position corresponding to the contact member 1021. However, the contact member 1021 may be electrically connected with the control electrode 110 of the switch transistor 1013 in the position corresponding to the contact member 1021 by electrically contacting a connection member of the first substrate 101 which is electrically connected with the control electrode 110 of the switch transistor 1013.

Furthermore, in some embodiments, the scan lines 1011 and the data lines 1012 may be replaced with any other wirings.

In addition, in some embodiments, at least one of the scan line 1011, the data line 1012, the switch transistor 1013, the photosensitive element 1014, and the conductive contact member 1021 which are configured to identify a fingerprint may be located in a display region or a non-display region of the display panel.

In the present embodiment, the first substrate 101 and the second substrate 102 are assembled together to form a display panel 10 (referring to FIG. 5). The first substrate 101 is formed with: the scan lines 1011 and the data lines 1012 crossing one another, the plurality of switch transistors 1013 arranged in an array, and the plurality of photosensitive elements 1014 arranged in an array. The first electrodes 111 of the switch transistors 1013 are connected with the data lines 1012, respectively, and the second electrodes 112 of the switch transistors 1013 are connected with the photosensitive elements 1014, respectively. The first electrodes 111 of the switch transistors 1013 are each a source electrode and the second electrodes 112 of the switch transistors 1013 are each a drain electrode, or, the first electrodes 111 of the switch transistors 1013 are each a drain electrode and the second electrodes 112 of the switch transistors 1013 are each a source electrode. The control electrodes 110 of the switch transistors 1013 may be each a gate electrode. The first electrodes 111, the second electrodes 112, and the control electrodes 110 of the switch transistors 1013 are not limited to those described in the embodiments, and may be set according to actual situations. In related art, control electrodes of switch transistors are connected directly with scan lines, respectively, and the switch transistors are in a normally on state so that power consumption is relatively great. In the present embodiment, the control electrodes of the switch transistors 1013 are electrically connected with the scan lines 1011 through the contact members of the second substrate 102, respectively. Specifically, the second substrate 102 is formed with the plurality of conductive contact members 1021. The contact members 1021 may be electrically connected with the scan lines 1011 through conducting wires, respectively, or the contact members 1021 may also be electrically connected with the scan lines 1011 in any other manner, respectively. The manner of electrical connection between the contact members 1021 and the scan lines 1011 is not limited to those described in the embodiments, and may be set according to actual situations. Each of the contact members 1021 is spaced from the control electrode 110 of one, in a position corresponding to the each of the contact members 1021, of the switch transistors 1013 by the preset distance. In other words, there is a gap between the end, adjacent to the first substrate 101, of each of the contact members 1021 and the control electrode 110 of one, in a position corresponding to the each of the contact members 1021, of the switch transistors 1013, in a direction perpendicular to the first substrate 101. When no force is applied to the second substrate 102, the contact members 1021 do not contact the control electrodes 110 of the switch transistors 1013 at all so that the scan lines 1011 are disconnected from the control electrodes of the switch transistors 1013 and thus the switch transistors 1013 are turned off. An orthogonal projection of an end, adjacent to the first substrate 101, of each of the contact members 1021 on the first substrate 101 partially overlaps an orthogonal projection of a control electrode 110 of one, in a position corresponding to the each of the contact members 1021, of the switch transistors 1013 on the first substrate 101. When the second substrate 102 is deformed by a force, at least one of the contact members 1021 in a location where the force is applied electrically contacts the control electrode 110 of at least one of the switch transistors 1013 in a position corresponding to the at least one of the contact members 1021, so that at least one of the scan lines 1011 is electrically connected with the control electrode 110 of the at least one of the switch transistors 1013 and thus the at least one of the switch transistors 1013 is turned on. Therefore, only when the second substrate 102 is deformed by the force, the at least one of the switch transistors 1013 is turned on. The switch transistors 1013 are normally turned off, so that power consumption is reduced.

According to embodiments of the present disclosure, referring to FIG. 3 which is a schematic diagram showing a configuration of a display panel, a surface of the first substrate 101 adjacent to the second substrate 102 is covered with a protective layer 103.

The protective layer 103 is formed with a plurality of through holes 113, and each of the contact members 1021 electrically contacts the control electrode 110 of one, located in a position corresponding to the each of the contact members 1021, of the switch transistors 1013 through one of the through holes 113. For example, an orthogonal projection of each of the through holes 113 on the first substrate 101 partially overlaps an orthogonal projection of the control electrode 110 of one, corresponding to the each through hole 113, of the switch transistors 1013 on the first substrate 101.

In the present embodiment, the surface of the first substrate 101 is covered with the protective layer 103 for protecting the scan lines 1011, the data lines 1012 and the likes. The orthogonal projection of each of the through holes 113 on the first substrate 101 partially overlaps the orthogonal projection of the control electrode 110 of one, corresponding to the each through hole 113, of the switch transistors 1013 on the first substrate 101. In other words, the through holes 113 are formed in the protective layer 103 in positions corresponding to the control electrodes 110 of the switch transistors 1013, respectively. The protective layer 103 may be an organic coating, or may also be made of any other material. The material of the protective layer is not limited to that described in the embodiments, and may be any other material selected according to actual situations.

According to embodiments of the present disclosure, referring to FIG. 3 which is the schematic diagram showing the configuration of the display panel, the preset distance is less than a thicknesses of the protective layer 103.

In the present embodiment, the preset distance between the contact member 1021 and the control electrode 110 of the switch transistor 1013 is less than the thicknesses of the protective layer 103. In other words, the ends of the contact members 1021 adjacent to the first substrate 101 are located in the through holes 113 of the protective layer 103, respectively. There are no limitations on the preset distance and the thickness of the protective layer in the embodiments of the present disclosure, and the preset distance and the thickness of the protective layer may be set according to actual situations.

According to embodiments of the present disclosure, the spacer or contact member 1021 is doped with an electrically-conductive material, such as a metal material.

In the present embodiment, in order that the scan lines 1011 are electrically connected with the control electrodes 110 of the switch transistors 1013 through the contact members 1021, respectively, the conductive contact members 1021 are doped with an electrically-conductive material, for example a metal material, such as gold balls. The conductive contact members are not limited to those described in the embodiments of the present disclosure, and may be set according to actual situations.

As described above, in the embodiments of the present disclosure, the display panel comprises a first substrate and a second substrate assembled together. The first substrate is formed with the scan lines, the data lines, the plurality of switch transistors, and the plurality of photosensitive elements, while the second substrate is formed with the plurality of conductive contact members. The contact members are electrically connected with the scan lines of the first substrate, respectively; and the orthogonal projection of the end, adjacent to the first substrate, of each of the contact members on the first substrate partially overlaps the orthogonal projection of the control electrode of one, located in a position corresponding to the each of the contact members, of the switch transistors on the first substrate. Each of the contact members is spaced from the control electrode of one, located in a position corresponding to the each of the contact members, of the switch transistors by the preset distance. When no force is applied to the second substrate, the contact members do not contact the control electrodes of the switch transistors so that the scan lines are disconnected from the control electrodes of the switch transistors and thus the switch transistors are not turned on. When the second substrate is deformed by the force, at least one of the contact members in a location where the force is applied electrically contacts the control electrode of at least one of the switch transistors in a position corresponding to the at least one of the contact members, so that at least one of the scan lines is electrically connected with the control electrode of the at least one of the switch transistors and thus the at least one of the switch transistors is turned on. According to the embodiments of the present disclosure, only when the second substrate is deformed by the force, the at least one of the switch transistors is turned on. The switch transistors are normally turned off, so that power consumption is reduced.

Figure 4:
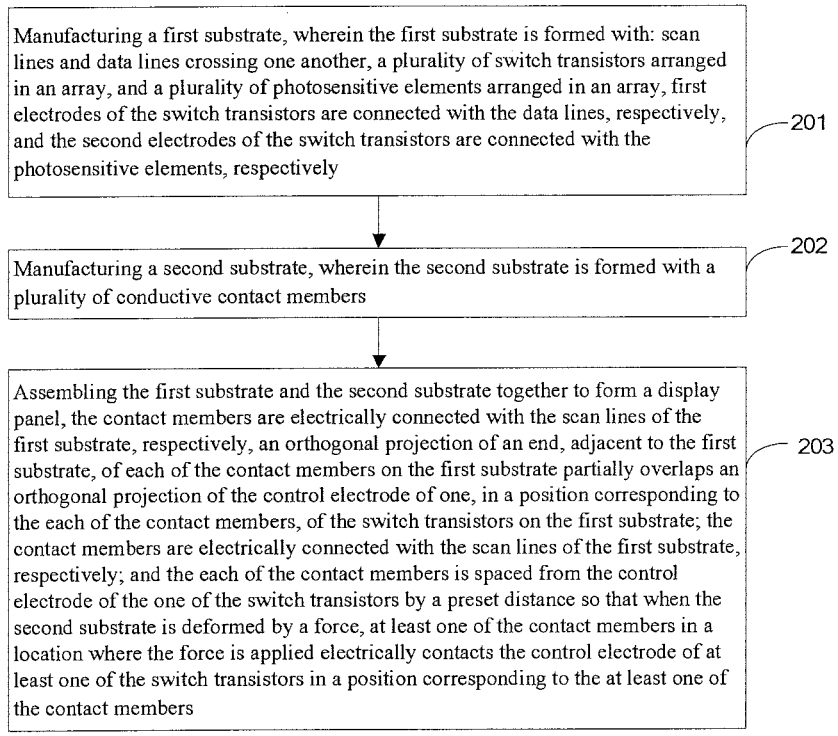
FIG. 4 is a flow diagram of a method of manufacturing a display panel according to an embodiment of the present disclosure.

Referring to FIG. 4, embodiments of the present disclosure provide a method of manufacturing a display panel. The method comprises: manufacturing a first substrate 101, the first substrate 101 being formed with: a plurality of switch transistors 1013 arranged in an array, and a plurality of photosensitive elements 1014 arranged in an array and respectively connected with the plurality of switch transistors 1013; manufacturing a second substrate 102, the second substrate 102 being formed with a plurality of conductive contact members 1021, and the plurality of contact members 1021 each having an end adjacent to the first substrate 101; and assembling the first substrate 101 and the second substrate 102 together to form a display panel. The end of each of the contact members 1021 is spaced from the first substrate 101 by a preset distance so that when the second substrate 102 is deformed by a force, the end of at least one of the contact members 1021 electrically contacts the first substrate 101 so that at least one of the switch transistors 1013 in a position corresponding to the at least one of the contact members 1021 is turned on.

In an embodiment of the present disclosure, referring to FIG. 1 to FIG. 5, the switch transistors 1013 each have a control electrode 110 configured to control a turn-on of the switch transistor 1013, a first electrode 111 and a second electrode 112. The second electrode 112 is connected with one of the photosensitive elements 1014 to input an induced current generated by the one of the photosensitive elements 1014 when the one of the photosensitive elements 1014 is irradiated by a light, and the first electrode 111 is configured to output the induced current when the switch transistor 1013 is turned on. The first substrate 101 is formed with scan lines 1011 and data lines 1012. The first electrodes 111 of the switch transistors 1013 are connected with the data lines 1012, respectively, and the contact members 1021 are electrically connected with the scan lines 1011 of the first substrate 101, respectively.

In an embodiment of the present disclosure, referring to FIG. 1 to FIG. 5, an orthogonal projection of the end of each of the contact members 1021 on the first substrate 101 partially overlaps an orthogonal projection of the control electrode 110 of one, in a position corresponding to the each of the contact members 1021, of the switch transistors 1013 on the first substrate 101, and the each of the contact members 1021 is spaced from the control electrode 110 of the one of the switch transistors 1013 by the preset distance so that when the second substrate 102 is deformed by the force, at least one of the contact members 1021 in a location where the force is applied electrically contacts the control electrode 110 of at least one of the switch transistors 1013 in a position corresponding to the at least one of the contact members 102.

In an embodiment of the present disclosure, referring to FIG. 1 to FIG. 5, the method further comprises: after manufacturing the first substrate 101, forming a protective layer 103 on a surface of the first substrate 101 adjacent to the second substrate 102; and forming a plurality of through holes 113 in the protective layer 103. Each of the contact members 1021 electrically contacts the control electrode 110 of one, located in a position corresponding to the each of the contact members 1021, of the switch transistors 1013 through one of the through holes 113. An orthogonal projection of each of the through holes 113 on the first substrate 101 partially overlaps an orthogonal projection of the control electrode 110 of one, corresponding to the each through hole 113, of the switch transistors 1013 on the first substrate 101.

FIG. 4 is a flow diagram of a method of manufacturing a display panel according to an embodiment of the present disclosure.

Referring to FIG. 4, the method comprises a step 201 of manufacturing a first substrate. The first substrate is formed with: scan lines and data lines crossing one another, a plurality of switch transistors arranged in an array, and a plurality of photosensitive elements arranged in an array. First electrodes of the switch transistors are connected with the data lines, respectively, and the second electrodes of the switch transistors are connected with the photosensitive elements, respectively.

In the present embodiment, the first substrate 101 is manufactured. The first substrate 101 is formed with the scan lines 1011, the data lines 1012, the plurality of switch transistors 1013, and the plurality of photosensitive elements 1014. The first electrodes 111 of the switch transistors 1013 are connected with the data lines 1012, respectively, and the second electrodes 112 of the switch transistors 1013 are connected with the photosensitive elements 1014, respectively. Control electrodes 110 of the switch transistors 1013 are not connected with the scan lines 1011.

According to embodiments of the present disclosure, a protective layer 103 is formed on a surface of the first substrate 101 adjacent to the second substrate 102, and a plurality of through holes 113 are formed in the protective layer 103. An orthogonal projection of each of the through holes 113 on the first substrate 101 partially overlaps an orthogonal projection of the control electrode 110 of one, corresponding to the each through hole 113, of the switch transistors 1013 on the first substrate 101.

In the present embodiment, after the first substrate 101 is manufactured, a surface of the first substrate 101 may also be covered with a protective layer 103 for protecting the scan lines 1011, the data lines 1012 and the likes. The protective layer 103 may be an organic coating, or may also be made of any other material. After the protective layer 103 is formed, a plurality of through holes 113 are formed in the protective layer 103. An orthogonal projection of each of the through holes 113 on the first substrate 101 partially overlaps an orthogonal projection of the control electrode 110 of one, corresponding to the each through hole 113, of the switch transistors 1013 on the first substrate 101. In other words, the through holes 113 are formed in the protective layer 103 in positions corresponding to the control electrodes 110 of the switch transistors 1013, respectively, thereby exposing a part of a surface or an entire surface of each of the control electrodes 110 of the switch transistors 1013.

Referring to FIG. 4, the method further comprises a step 202 of manufacturing a second substrate. The second substrate is formed with a plurality of conductive contact members.

In the present embodiment, the second substrate 102 is formed with the plurality of conductive contact members 1021. There is no limitation on a forming manner of the conductive contact members in the embodiments of the present disclosure, and the forming manner of the conductive contact members may be set according to actual situations. According to an embodiment of the present disclosure, the contact members 1021 are doped with an electrically-conductive material, such as a metal material, in order that the scan lines 1011 are electrically connected with the control electrodes 110 of the switch transistors 1013 through the contact members 1021, respectively. The metal material may be gold, or may also be any other material. The material of the conductive contact members is not limited to those described in the embodiments of the present disclosure, and may be any other material selected according to actual situations.

Referring to FIG. 4, the method further comprises a step 203 of assembling the first substrate and the second substrate together to form a display panel. The contact members are electrically connected with the scan lines of the first substrate, respectively. An orthogonal projection of an end, adjacent to the first substrate, of each of the contact members on the first substrate partially overlaps an orthogonal projection of the control electrode of one, in a position corresponding to the each of the contact members, of the switch transistors on the first substrate. The each of the contact members is spaced from the control electrode of the one of the switch transistors by the preset distance so that when the second substrate is deformed by the force, at least one of the contact members in a location where the force is applied electrically contacts the control electrode of at least one of the switch transistors in a position corresponding to the at least one of the contact members.

In the present embodiment, the first substrate 101 and the second substrate 102 are assembled together to form a display panel 10. In an assembling process, the contact members 1021 are electrically connected with the scan lines 1011, respectively, and an orthogonal projection of an end, adjacent to the first substrate 101, of each of the contact members 1021 on the first substrate 101 partially overlaps an orthogonal projection of a control electrode 110 of one, in a position corresponding to the each of the contact members 1021, of the switch transistors 1013 on the first substrate 101. Each of the contact members 1021 is spaced from the control electrode 110 of one, in a position corresponding to the each of the contact members 1021, of the switch transistors 1013 by the preset distance. When no force is applied to the second substrate 102, the contact members 1021 do not contact the control electrodes 110 of the switch transistors 1013 so that the scan lines 1011 are disconnected from the control electrodes 110 of the switch transistors 1013. When the second substrate 102 is deformed by a force, at least one of the contact members 1021 in a location where the force is applied electrically contacts the control electrode 110 of at least one of the switch transistors 1013 in a position corresponding to the at least one of the contact members 1021, so that the at least one of the contact members 1021 is electrically connected with the control electrode 110 of the at least one of the switch transistors 1013. In addition, the contact members 1021 are electrically connected with the scan lines 1011, respectively. Therefore, at least one of the scan lines 1011 is electrically connected with the control electrode 110 of the at least one of the switch transistors 1013 through the at least one of the contact members 1021.

As described above, in the embodiments of the present disclosure, the method comprises: manufacturing the first substrate, the first substrate being formed with: the scan lines, the data lines, the plurality of switch transistors, and the plurality of photosensitive elements; manufacturing the second substrate, the second substrate being formed with the plurality of conductive contact members; and assembling the first substrate and the second substrate together to form a display panel. The contact members are electrically connected with the scan lines of the first substrate, respectively, and the orthogonal projection of the end, adjacent to the first substrate, of each of the contact members on the first substrate partially overlaps the orthogonal projection of the control electrode of one, in a position corresponding to the each of the contact members, of the switch transistors on the first substrate. Each of the contact members is spaced from the control electrode of one, in a position corresponding to the each of the contact members, of the switch transistors by the preset distance. When no force is applied to the second substrate, the contact members do not contact the control electrodes of the switch transistors so that the scan lines are disconnected from the control electrodes of the switch transistors and thus the switch transistors are not turned on. When the second substrate is deformed by a force, at least one of the contact members in a location where the force is applied electrically contacts the control electrode of at least one of the switch transistors in a position corresponding to the at least one of the contact members, so that at least one of the scan lines is electrically connected with the control electrode of the at least one of the switch transistors and thus the at least one of the switch transistors is turned on. According to the embodiments of the present disclosure, only when the second substrate is deformed by the force, the at least one of the switch transistors is turned on. The switch transistors are normally turned off, so that power consumption is reduced.

Referring to FIG. 5, embodiments of the present disclosure provide a fingerprint identification device. The fingerprint identification device comprises: a light source 30, an identification module 40, and the display panel described in any one of the above embodiments. The identification module 40 is connected with the display panel. The light source 30 has a light emitting face facing towards the display panel, and is configured to emit a detection light. The display panel is configured such that when a finger of a user is pressed against the display panel, at least one of the switch transistors 1013 is turned on, and each of the photosensitive elements 1014 is configured to generate an induced current according to a part of the detection light reflected from the finger of the user; and the identification module 40 is configured to identify a fingerprint of the user according to the induced current. The identification module is computer implemented.

In an embodiment of the present disclosure, referring to FIG. 1 to FIG. 3 and FIG. 5, the switch transistors 1013 each have a control electrode 110 configured to control a turn-on of the switch transistor 1013, a first electrode 111 and a second electrode 112. The second electrode 112 is connected with one of the photosensitive elements 1014 to input the induced current generated by the one of the photosensitive elements 1014, and the first electrode 111 is configured to output the induced current when the switch transistor 1013 is turned on; and the display panel is configured such that when a finger of a user is pressed against the display panel, at least one of the contact members 1021 in a location where a force is applied by the finger electrically contacts the control electrode 110 of at least one of the switch transistors 1013 in a position corresponding to the at least one of the contact members 1021, so that the at least one of the switch transistors 1013 is turned on.

In an embodiment of the present disclosure, referring to FIG. 1 to FIG. 3 and FIG. 5, the first substrate 101 is further formed with scan lines 1011 and data lines 1012, and the first electrodes 111 of the switch transistors 1013 are connected with the data lines 1012, respectively; the contact members 1021 are electrically connected with the scan lines 1011 of the first substrate 101, respectively; and the scan lines 1011 are connected with the control electrodes 110 of the switch transistors 1013 through the contact members 1021, respectively.

In an embodiment of the present disclosure, referring to FIG. 1 to FIG. 3 and FIG. 5, an orthogonal projection of the end of each of the contact members 1021 on the first substrate 101 partially overlaps an orthogonal projection of the control electrode 110 of one, in a position corresponding to the each of the contact members 1021, of the switch transistors 1013 on the first substrate 101, and the each of the contact members 1021 is spaced from the control electrode 110 of the one of the switch transistors 1013 by the preset distance so that when the second substrate 102 is deformed by the force, at least one of the contact members 1021 in a location where the force is applied electrically contacts the control electrode 110 of at least one of the switch transistors 1013 in a position corresponding to the at least one of the contact members 102.

FIG. 5 is a schematic diagram showing a configuration of a fingerprint identification device according to an embodiment of the present disclosure. Referring to FIG. 5, the fingerprint identification device comprises: a light source 30, an identification module 40, and the display panel 10 described in any one of the above embodiments. The identification module 40 is connected with the display panel 10. The light source 30 has a light emitting face facing towards the display panel 10, and is configured to emit a detection light. The display panel 10 is configured such that when a finger of a user is pressed against the display panel 10, at least one of the contact members 1021 in a location where a force is applied by the finger electrically contacts the control electrode 110 of at least one of the switch transistors 1013 in a position corresponding to the at least one of the contact members 1021, and at least one of the scan lines 1011 is electrically connected with the control electrode 110 of the at least one of the switch transistors 1013 through the at least one of the contact members 1021, so that the at least one of the switch transistors 1013 is turned on. Each of the photosensitive elements 1014 is configured to generate an induced current according to a part of the detection light reflected from the finger of the user. The identification module 40 is configured to identify a fingerprint of the user according to the induced current.

In the present embodiment, the light source 30 emits the detection light, and the detection light is reflected after being irradiated onto a finger of a user. A part of the detection light reflected from a valley portion of the fingerprint is different from that of the detection light reflected from a ridge portion of the fingerprint due to difference between a valley and a ridge of the fingerprint. When the finger of the user is pressed against the display panel 10, at least one of the contact members 1021 in a location where a force is applied by the finger electrically contacts the control electrode 110 of at least one of the switch transistors 1013 in a position corresponding to the at least one of the contact members 1021, and at least one of the scan lines 1013 is electrically connected with the control electrode 110 of the at least one of the switch transistors 1013 through the at least one of the contact members 1021, so that the at least one of the switch transistors 1013 is turned on. Meanwhile, the photosensitive elements 1014 generate induced currents according to the reflected lights. Specifically, the photosensitive elements generate first induced currents and second induced currents by means of lights reflected from the valley portions and lights reflected from the ridges portions, respectively. The photosensitive elements 1014 may be photosensitive diodes, or any other elements. There is no limitation on the photosensitive elements in the embodiments of the present disclosure, and the photosensitive elements 1014 may be any other elements selected according to actual situations. The first and second induced currents generated by the photosensitive elements 1014 flow into the data lines 1012, respectively, and the identification module 40 receives the first and second induced currents flowing into the data lines 1012. The valley portions and the ridges portions of the fingerprint are determined by comparing the first induced currents with the second induced currents, thereby identifying the fingerprint of the user.

As described above, in the embodiments of the present disclosure, the fingerprint identification device comprises: the light source, the identification module, and the display panel. The light source is configured to emit the detection light. When a finger of a user is pressed against the display panel, at least one of the contact members in a location where a force is applied by the finger electrically contacts the control electrode of at least one of the switch transistors in a position corresponding to the at least one of the contact members, and at least one of the scan lines is electrically connected with the control electrode of the at least one of the switch transistors through the at least one of the contact members, so that the at least one of the switch transistors is turned on. Each of the photosensitive elements generates an induced current according to a part of the detection light reflected from the finger of the user. The identification module identifies a fingerprint of the user according to the induced current. According to the embodiments of the present disclosure, only when the finger of the user is pressed against the display panel, the at least one of the switch transistors of the display panel is turned on and the fingerprint identification device operates. The switch transistors are normally turned off, so that power consumption is reduced.

Figure 6:
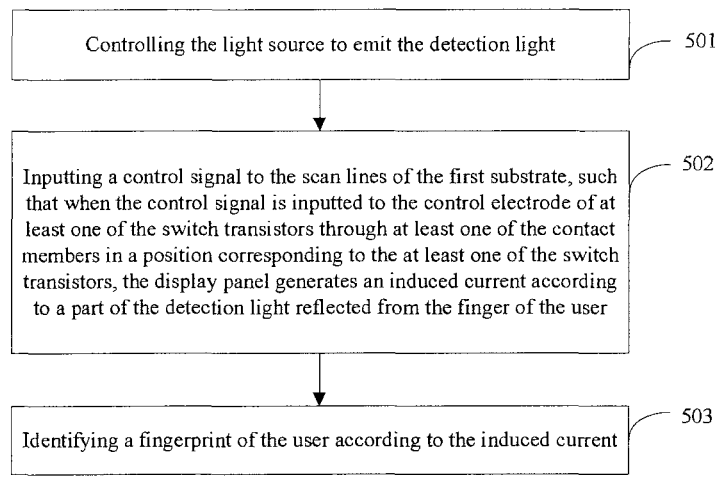
FIG. 6 is a flow diagram of a method of identifying a fingerprint according to an embodiment of the present disclosure.

Referring to FIG. 6, embodiments of the present disclosure provide a method of identifying a fingerprint by using the fingerprint identification device according to any one of the above embodiments. The method comprises: controlling the light source 30 to emit the detection light; inputting a control signal such that when the control signal is inputted to the control electrode 110 of at least one of the switch transistors 1013 through at least one of the contact members 1021 in a position corresponding to the at least one of the switch transistors 1013, the display panel generates an induced current according to a part of the detection light reflected from a finger of a user; and identifying a fingerprint of the user according to the induced current.

FIG. 6 is a flow diagram of a method of identifying a fingerprint according to an embodiment of the present disclosure. This method is a method of identifying a fingerprint by using the fingerprint identification device according to any one of the above embodiments.

Referring to FIG. 6, the method comprises a step 501 of controlling the light source to emit the detection light.

In the present embodiment, the light source 30 may be controlled to emit the detection light when a finger of a user is pressed against the second substrate 102, or the light source 30 may also be controlled to emit light in any other manner. The manner of controlling the light source is not limited to those described in the embodiments of the present disclosure, and may be set according to actual situations. The detection light is reflected by a finger of a user after being irradiated onto the finger.

Referring to FIG. 6, the method further comprises a step 502 of inputting a control signal to the scan lines of the first substrate, such that when the control signal is inputted to the control electrode of at least one of the switch transistors through at least one of the contact members in a position corresponding to the at least one of the switch transistors, the display panel generates an induced current according to a part of the detection light reflected from the finger of the user.

In the present embodiment, when the light source 30 is controlled to emit the detection light, the control signal may be inputted to the scan lines 1011 of the first substrate 101. Meanwhile, the second substrate 102 is deformed by a force. Thereby, at least one of the scan lines 1011 is electrically connected with the control electrode 110 of at least one of the switch transistors 1013 through at least one of the contact members 1021 in a position corresponding to the at least one of the switch transistors 1013, and the control signal is input to the control electrode 110 of the at least one of the switch transistors 1013 through the at least one of the contact members 1021, so that the at least one of the switch transistors 1013 is turned on. The photosensitive elements 1014 of the display panel 10 each generate an induced current according to a part of the detection light reflected from the finger of the user; and when the switch transistors 1013 are turned on, the induced currents flow into the data lines 1012, respectively.

Referring to FIG. 6, the method further comprises a step 503 of identifying a fingerprint of the user according to the induced current.

In the present embodiment, the induced currents flowing into the data lines 1012 are compared with predetermined currents, and a fingerprint of the user is identified according to differences between the induced currents and the predetermined currents. There is no limitation on how to compare the induced currents with the predetermined currents in the embodiments of the present disclosure, and how to compare the induced currents with the predetermined currents may be set according to actual situations.

As described above, in the embodiments of the present disclosure, when a fingerprint is identified, the light source is controlled to emit the detection light. A control signal is inputted to the scan lines of the first substrate. The control signal is inputted to the control electrode of at least one of the switch transistors through at least one of the contact members in a position corresponding to the at least one of the switch transistors, and the display panel generates an induced current according to a part of the detection light reflected from the finger of the user. Finally, a fingerprint of the user is identified according to the induced current. According to the embodiments of the present disclosure, when the finger of the user is pressed against the display panel, the control signal is inputted from the scan lines to the control electrodes of the switch transistors, so that the switch transistors are turned on, thereby identifying a fingerprint. When the finger of the user is not pressed against the display panel, the switch transistors are not turned on. The switch transistors are normally turned off, so that power consumption is reduced.

These embodiments of the present disclosure are described in a progressive manner. The contents mainly described in each of the embodiments are different from those mainly described in other embodiments. For the contents not described in each embodiment, those described in other embodiments may be taken as reference.

Apparently, various changes and modifications to the present disclosure may be made by those skilled in the art without departing from the spirit and scope of the disclosure. Therefore, if these changes and modifications to the present disclosure belong to the scope defined in the appended claims of the present disclosure and their equivalents, the present disclosure is intended to include these changes and modifications.

What is claimed is:

1. A display panel comprising:
a first substrate and a second substrate disposed opposite to each other,
wherein the first substrate is formed with: a plurality of switch transistors arranged in an array, and a plurality of photosensitive elements arranged in an array and respectively connected with the plurality of switch transistors; and
wherein the second substrate is formed with a plurality of conductive contact members, the plurality of contact members each have an end adjacent to the first substrate, and the end of each of the contact members is spaced from the first substrate by a preset distance so that when the second substrate is deformed by a force, the end of at least one of the contact members electrically contacts the first substrate so that at least one of the switch transistors in a position corresponding to the at least one of the contact members is turned on.

2. The display panel of claim 1, wherein:
the switch transistors each have a control electrode configured to control a turn-on of the switch transistor, a first electrode and a second electrode, the second electrode is connected with one of the photosensitive elements to input an induced current generated by the one of the photosensitive elements when the one of the photosensitive elements is irradiated by a light, and the first electrode is configured to output the induced current when the switch transistor is turned on.

3. The display panel of claim 2, wherein:
the first substrate is further formed with scan lines and data lines;
the first electrodes of the switch transistors are connected with the data lines, respectively; and
the contact members are electrically connected with the scan lines of the first substrate, respectively.

4. The display panel of claim 2, wherein:
an orthogonal projection of the end of each of the contact members on the first substrate partially overlaps an orthogonal projection of the control electrode of one, in a position corresponding to the each of the contact members, of the switch transistors on the first substrate, and the each of the contact members is spaced from the control electrode of the one of the switch transistors by the preset distance so that when the second substrate is deformed by the force, at least one of the contact members in a location where the force is applied electrically contacts the control electrode of at least one of the switch transistors in a position corresponding to the at least one of the contact members.

5. The display panel of claim 4, wherein:
a surface of the first substrate adjacent to the second substrate is covered with a protective layer; and
the protective layer is formed with a plurality of through holes, and each of the contact members electrically contacts the control electrode of one, located in a position corresponding to the each of the contact members, of the switch transistors through one of the through holes.

6. The display panel of claim 5, wherein:
an orthogonal projection of each of the through holes on the first substrate partially overlaps an orthogonal projection of the control electrode of one, corresponding to the each through hole, of the switch transistors on the first substrate.

7. The display panel of claim 5, wherein:
the preset distance is less than a thicknesses of the protective layer.

8. The display panel of claim 1, wherein:
the contact member comprises a spacer.

9. The display panel of claim 1, wherein:
the contact members are doped with an electrically-conductive material.

10. The display panel of claim 1, wherein:
the plurality of switch transistors and the plurality of photosensitive elements are disposed in a display region.

11. A method of manufacturing a display panel, the method comprising:
manufacturing a first substrate, wherein the first substrate is formed with: a plurality of switch transistors arranged in an array, and a plurality of photosensitive elements arranged in an array and respectively connected with the plurality of switch transistors;
manufacturing a second substrate, wherein the second substrate is formed with a plurality of conductive contact members, and the plurality of contact members each have an end adjacent to the first substrate; and
assembling the first substrate and the second substrate together to form a display panel, wherein the end of each of the contact members is spaced from the first substrate by a preset distance so that when the second substrate is deformed by a force, the end of at least one of the contact members electrically contacts the first substrate so that at least one of the switch transistors in a position corresponding to the at least one of the contact members is turned on.

12. The method of claim 11, wherein:
the switch transistors each have a control electrode configured to control a turn-on of the switch transistor, a first electrode and a second electrode, the second electrode is connected with one of the photosensitive elements to input an induced current generated by the one of the photosensitive elements when the one of the photosensitive elements is irradiated by a light, and the first electrode is configured to output the induced current when the switch transistor is turned on;
the first substrate is further formed with scan lines and data lines;

the first electrodes of the switch transistors are connected with the data lines, respectively; and
the contact members are electrically connected with the scan lines of the first substrate, respectively.

13. The method of claim 12, wherein:
an orthogonal projection of the end of each of the contact members on the first substrate partially overlaps an orthogonal projection of the control electrode of one, in a position corresponding to the each of the contact members, of the switch transistors on the first substrate, and the each of the contact members is spaced from the control electrode of the one of the switch transistors by the preset distance so that when the second substrate is deformed by the force, at least one of the contact members in a location where the force is applied electrically contacts the control electrode of at least one of the switch transistors in a position corresponding to the at least one of the contact members.

14. The method of claim 12, further comprising:
after manufacturing the first substrate, forming a protective layer on a surface of the first substrate adjacent to the second substrate; and forming a plurality of through holes in the protective layer, wherein each of the contact members electrically contacts the control electrode of one, located in a position corresponding to the each of the contact members, of the switch transistors through one of the through holes, wherein an orthogonal projection of each of the through holes on the first substrate partially overlaps an orthogonal projection of the control electrode of one, corresponding to the each through hole, of the switch transistors on the first substrate.

15. A fingerprint identification device, comprising:
a light source, an identification module, and the display panel according to claim 1, wherein the identification module is connected with the display panel;
wherein the light source has a light emitting face facing towards the display panel, and is configured to emit a detection light;
wherein the display panel is configured such that when a finger of a user is pressed against the display panel, at least one of the switch transistors is turned on, and each of the photosensitive elements is configured to generate an induced current according to a part of the detection light reflected from the finger of the user; and
wherein the identification module is configured to identify a fingerprint of the user according to the induced current.

16. The fingerprint identification device of claim 15, wherein:
the switch transistors each have a control electrode configured to control a turn-on of the switch transistor, a first electrode and a second electrode, the second electrode is connected with one of the photosensitive elements to input the induced current generated by the one of the photosensitive elements, and the first electrode is configured to output the induced current when the switch transistor is turned on; and
the display panel is configured such that when the finger of the user is pressed against the display panel, at least one of the contact members in a location where a force is applied by the finger electrically contacts the control electrode of at least one of the switch transistors in a position corresponding to the at least one of the contact members, so that the at least one of the switch transistors is turned on.

17. The fingerprint identification device of claim 16, wherein:
- the first substrate is further formed with scan lines and data lines;
- the first electrodes of the switch transistors are connected with the data lines, respectively;
- the contact members are electrically connected with the scan lines of the first substrate, respectively; and
- the scan lines are connected with the control electrodes of the switch transistors through the contact members, respectively.

18. The fingerprint identification device of claim 16, wherein:
- an orthogonal projection of the end of each of the contact members on the first substrate partially overlaps an orthogonal projection of the control electrode of one, in a position corresponding to the each of the contact members, of the switch transistors on the first substrate, and the each of the contact members is spaced from the control electrode of the one of the switch transistors by the preset distance so that when the second substrate is deformed by the force, at least one of the contact members in a location where the force is applied electrically contacts the control electrode of at least one of the switch transistors in a position corresponding to the at least one of the contact members.

19. A method of identifying a fingerprint by using the fingerprint identification device of claim 15, the method comprising:
- controlling the light source to emit the detection light;
- inputting a control signal, wherein when the control signal is inputted to the control electrode of at least one of the switch transistors through at least one of the contact members in a position corresponding to the at least one of the switch transistors, the display panel generates an induced current according to a part of the detection light reflected from the finger of the user; and
- identifying a fingerprint of the user according to the induced current.

20. The method of claim 19, wherein:
- the first substrate is further formed with scan lines and data lines, and the first electrodes of the switch transistors are connected with the data lines, respectively;
- the contact members are electrically connected with the scan lines of the first substrate, respectively;
- the scan lines are connected with the control electrodes of the switch transistors through the contact members, respectively; and
- inputting the control signal comprises inputting the control signal to the scan lines of the first substrate.

* * * * *